(12) United States Patent
Lee et al.

(10) Patent No.: US 12,094,918 B2
(45) Date of Patent: Sep. 17, 2024

(54) NANOROD LIGHT EMITTING DIODE AND METHOD OF FABRICATING THE SAME

(71) Applicant: Korea University Research and Business Foundation, Seoul (KR)

(72) Inventors: In-Hwan Lee, Seoul (KR); Taehwan Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 431 days.

(21) Appl. No.: 17/532,290

(22) Filed: Nov. 22, 2021

(65) Prior Publication Data

US 2022/0165788 A1 May 26, 2022

(30) Foreign Application Priority Data

Nov. 20, 2020 (KR) .......................... 10-2020-0156793

(51) Int. Cl.
*H01L 33/00* (2010.01)
*H01L 27/15* (2006.01)
(Continued)

(52) U.S. Cl.
CPC ........ *H01L 27/156* (2013.01); *H01L 33/0075* (2013.01); *H01L 33/0093* (2020.05);
(Continued)

(58) Field of Classification Search
CPC ............... H01L 27/156; H01L 33/0075; H01L 33/0093; H01L 33/06; H01L 33/24;
(Continued)

(56) References Cited

U.S. PATENT DOCUMENTS

2017/0317228 A1 11/2017 Sung
2019/0115492 A1 4/2019 Tamma et al.

FOREIGN PATENT DOCUMENTS

KR 10-1554032 B1 9/2015
KR 10-2016-0059576 A 5/2016
(Continued)

OTHER PUBLICATIONS

Korean Office Action issued on Jul. 28, 2022, in counterpart Korean Patent Application No. 10-2020-0156793 (5 pages in Korean).

(Continued)

*Primary Examiner* — Elias Ullah
(74) *Attorney, Agent, or Firm* — NSIP Law

(57) ABSTRACT

Disclosed is a technology of preferentially forming an ohmic contact layer and a conductor layer before separating a nanorod light emitting diode (LED) from a substrate, thereby being capable of omitting a heat treatment process performed at high temperature after aligning the nanorod LED, and, accordingly, preventing electrical short while maximizing the quantum efficiency of the nanorod LED and increasing a selection range of a material constituting a light emitting diode (LED) display. More particularly, the nanorod LED includes a first semiconductor layer; a multi-quantum well structure layer; a second semiconductor layer; and a conductor layer formed on at least one semiconductor layer of the first semiconductor layer and the second semiconductor layer, wherein a length and shape of the conductor layer are controlled such that the multi-quantum well structure layer is disposed between two electrodes of the electrode pattern on which the conductor layer is to be aligned.

13 Claims, 23 Drawing Sheets

(51) Int. Cl.
  *H01L 33/06* (2010.01)
  *H01L 33/24* (2010.01)
  *H01L 33/32* (2010.01)
  *H01L 33/38* (2010.01)
  *H01L 33/44* (2010.01)

(52) U.S. Cl.
  CPC .............. *H01L 33/06* (2013.01); *H01L 33/24* (2013.01); *H01L 33/32* (2013.01); *H01L 33/387* (2013.01); *H01L 33/44* (2013.01); *H01L 2933/0016* (2013.01); *H01L 2933/0025* (2013.01)

(58) Field of Classification Search
  CPC ....... H01L 33/32; H01L 33/387; H01L 33/44; H01L 2933/0016; H01L 2933/0025; H01L 25/0753; H01L 33/62; H01L 33/38; H01L 33/0008; H01L 33/12; H01L 33/14; H01L 2933/0058; H01L 2933/0066
  See application file for complete search history.

(56) References Cited

FOREIGN PATENT DOCUMENTS

| KR | 10-2019-0099620 A | 8/2019 |
| KR | 2019 0112226 A | 10/2019 |
| KR | 10-2020-0015871 A | 2/2020 |
| KR | 2020 0013190 A | 2/2020 |
| KR | 10-2020-0034801 A | 3/2020 |

OTHER PUBLICATIONS

Korean Notice of Allowance issued on Jan. 13, 2022 in counterpart Korean Patent Application No. 10-2020-0156793 (4 pages in Korean).

NANOROD LIGHT EMITTING DIODE AND METHOD OF FABRICATING THE SAME

CROSS-REFERENCE TO RELATED APPLICATION

This application claims the priority benefit of Korean Patent Application No. 10-2020-0156793, filed on Nov. 20, 2020 in the Korean Intellectual Property Office, the disclosure of which is incorporated herein by reference.

BACKGROUND OF THE DISCLOSURE

Field of the Disclosure

The present disclosure relates to a nanorod light emitting diode (LED) in which a conductor layer with various shapes and lengths is formed, and a method of fabricating the nanorod LED, and more particularly, to a technology of preferentially forming an ohmic contact layer and a conductor layer before separating a nanorod LED from a substrate, thereby being capable of omitting a heat treatment process performed at high temperature after aligning the nanorod LED, and, accordingly, preventing electrical short while maximizing the quantum efficiency of the nanorod LED and increasing a selection range of a material constituting a light emitting diode (LED) display.

Description of the Related Art

In the case of conventional technology, GaN nanorod light emitting diodes (LEDs) form point contact with electrodes when are aligned in an interdigitated (IDT) pattern, which causes a poor current injection problem.

In addition, the conventional technology adopts a manner wherein, after fabricating nanorods, the fabricated nanorods are directly aligned and contacted through heat treatment or plating. Accordingly, an ohmic contact is not properly made to a p-GaN semiconductor layer, which causes decrease in current injection efficiency.

To address the problems, an n-GaN semiconductor layer and a p-GaN semiconductor layer are exposed by a photolithography process, and n-contact and p-contact are formed by an atomic layer deposition (ALD) method using deposition equipment with high coverage.

After the photolithography process, heat treatment (annealing) is performed at high temperature, and then a secondary photolithography process, etc. is required to carry out a process in which a conductor has an ohmic contact with the n-GaN semiconductor layer and the p-GaN semiconductor layer. Accordingly, there is a problem such as heat treatment at high temperature.

In addition, since the heat treatment is carried out at 400° C. or higher, printed circuit board (PCB) or glass is difficult to withstand a temperature of 400° C. or higher.

The thickness of InGaN/GaN epi are related to the thickness of n-GaN semiconductor layer, the thickness of a multi-quantum well structure layer and the thickness of p-GaN semiconductor layer.

Typically, the thickness of n-GaN semiconductor layer may be 1.5 to 2 μm, the thickness of a multi-quantum well structure layer may be 50 to 100 nm and the thickness of a p-GaN semiconductor layer may be 100 to 150 nm.

In the case of nanorods aligned by dielectrophoresis (DEP), a multi-quantum well structure layer may be located on an IDT pattern metal electrode. In this case, light does not emit by electrical short.

In the case of the conventional technology, so as to prevent electrical short, it may be considered to fabricate an IDT pattern thinly so that the metal pattern does not come into contact with a multi-quantum well structure layer and does only come into contact with a p-GaN semiconductor layer. However, reducing a metal pattern to a sub-micron level may be limited due to the limitations of photolithography in large displays. For example, a multi-quantum well structure layer includes an active layer.

As another method, it may be considered to make a p-GaN semiconductor layer long. In the case of the method, since the growth temperature of a p-GaN semiconductor layer is higher than the growth temperature of a multi-quantum well structure layer, the multi-quantum well structure layer is deteriorated when the p-GaN semiconductor layer is thickly grown so that efficiency is decreased.

Meanwhile, from the viewpoint of light emitting diode growth, there is an advantage that, as the thickness of thin film is reduced, stress applied to a multi-quantum well structure layer is relatively small and a growth time is reduced. Accordingly, it can be said that advantage increases as the length of nanorod is decreased.

However, electrical short may occur due to a thin p-GaN semiconductor layer.

Meanwhile, FIGS. 9 and 10 illustrate a configuration according to the conventional technology wherein the vicinity of a p-GaN semiconductor layer and n-GaN semiconductor layer is exposed, and a conductor is deposited on a pattern so as to increase a coverage ratio for the exposed parts. In the case of such a conventional technology, a pattern material is limited due to high-temperature processing performed upon deposition after the formation of a nanorod LED.

SUMMARY OF THE DISCLOSURE

Therefore, the present disclosure has been made in view of the above problems, and it is one object of the present disclosure to provide a GaN nanorod LED including a conductor layer with various shapes and lengths, thereby being capable of being efficiently aligned on various patterns and allowing current injection.

It is another object of the present disclosure to prevent the occurrence of electrical short by thinly forming a first semiconductor layer so as to increase quantum efficiency while minimizing the stress of a multi-quantum well structure layer, and by forming a conductor layer on at least one of the first and second semiconductor layers while controlling the length and shape of the conductor layer.

It is another object of the present disclosure to form an electrode contact having a relatively large area on first and second semiconductor layers by preferentially forming an ohmic contact layer and a conductor layer before separating a GaN nanorod LED from a substrate.

It is another object of the present disclosure to omit a heat treatment process, performed at high temperature after aligning nanorods on various patterns, by preferentially forming an ohmic contact layer and a conductor layer before separating a GaN nanorod LED from a substrate, thereby increasing a selection range of materials constituting a light emitting diode (LED) display.

It is yet another object of the present disclosure to omit heat treatment accompanying an unnecessary photolithography process by previously forming an ohmic contact layer and a conductor layer before aligning GaN nanorod LEDs on various patterns.

In accordance with an aspect of the present disclosure, the above and other objects can be accomplished by the provision of a nanorod light emitting diode (LED), including: a first semiconductor layer; a multi-quantum well structure layer; a second semiconductor layer; and a conductor layer formed on at least one semiconductor layer of the first semiconductor layer and the second semiconductor layer, wherein a length and shape of the conductor layer are controlled such that the multi-quantum well structure layer is disposed between two electrodes of the electrode pattern on which the conductor layer is to be aligned.

In accordance with an embodiment of the present disclosure, the nanorod LED may further include an ohmic contact layer formed between the at least one semiconductor layer and the conductor layer; and a passivation layer formed on opposite side surfaces of the first semiconductor layer, the multi-quantum well structure layer and the second semiconductor layer.

The conductor layer may be formed in any one shape of a shape inclined to one side, a shape parallel to the at least one semiconductor layer and a zigzag shape on the at least one semiconductor layer.

The electrode pattern may include at least one electrode pattern of an interdigitated (IDT) pattern and a circle pattern.

The conductor layer may be deposited by at least one method of an electroplating method, a sputtering method and a thermal evaporation method.

The second semiconductor layer, the multi-quantum well structure layer and the first semiconductor layer may be sequentially formed with respect to the substrate to form a vertical structure.

The first semiconductor layer may be a p-type impurity-doped gallium nitride (GaN) semiconductor layer (p-GaN) and may serve to supply holes, and the second semiconductor layer may be an n-type impurity-doped gallium nitride (GaN) semiconductor layer (n-GaN) and may serve to supply electrons.

The conductor layer may be formed of at least one conductive material of indium tin oxide (ITO) and a metal material.

In accordance with another aspect of the present disclosure, there is provided a method of fabricating a nanorod LED, the method including: sequentially forming a second semiconductor layer, a multi-quantum well structure layer and a first semiconductor layer on a substrate; forming a first deposition prevention layer such that a portion of the second semiconductor layer of the second semiconductor layer, the multi-quantum well structure layer, the first semiconductor layer is covered, and coating a passivation layer on the first deposition prevention layer; etching the coated passivation layer on the first semiconductor layer; and forming a second deposition prevention layer on the first deposition prevention layer, and depositing a conductor on the first semiconductor layer, wherein a length and shape of a first conductor layer are controlled such that the multi-quantum well structure layer is disposed between two electrodes on an electrode pattern on which the first conductor layer is to be aligned.

In accordance with an embodiment of the present disclosure, the method may further include: forming the first conductor layer on the first semiconductor layer, and then removing the first and second deposition prevention layers; etching the second semiconductor layer such that an upper part of the second semiconductor layer is exposed while lifting-off the substrate; and forming a third deposition prevention layer, and then depositing a conductor on the second semiconductor layer, wherein a length and shape of a second conductor layer are controlled such that the multi-quantum well structure layer is disposed between the two electrodes.

The forming of the first conductor layer may include depositing a conductor thicker than a reference in a state, in which a nanorod LED fabrication sample is inclined to one side, to form a first conductor layer having the shape inclined to one side.

The forming of the first conductor layer may include forming a first conductor layer having a shape parallel to the first semiconductor layer in a state in which a nanorod LED fabrication sample rotates.

The forming of the first conductor layer may include depositing a conductor thicker than a reference in a state, in which a nanorod LED fabrication sample rotates, to form a first conductor layer having a zigzag shape.

The electrode pattern may include at least one electrode pattern of an interdigitated (IDT) pattern and a circle pattern.

In accordance with yet another aspect of the present disclosure, there is provided a display, including: a plurality of nanorod LEDs aligned on an electrode pattern including first and second electrodes; and a conductor layer formed on at least one semiconductor layer of a first semiconductor layer, a multi-quantum well structure layer, a second semiconductor layer and the first semiconductor layer and the second semiconductor layer, wherein a length and shape of the conductor layer are controlled such that the multi-quantum well structure layer is disposed between the first electrode and the second electrode.

The electrode pattern may include at least one electrode pattern of an interdigitated (IDT) pattern and a circle pattern.

The first semiconductor layer may be a p-type impurity-doped gallium nitride (GaN) semiconductor layer (p-GaN) and may sever to supply holes, and the second semiconductor layer may be an n-type impurity-doped gallium nitride (GaN) semiconductor layer (n-GaN) and may serve to supply electrons.

The first electrode may contact a first conductor layer of the conductor layer, and the second electrode may contact a second conductor layer of the conductor layer.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
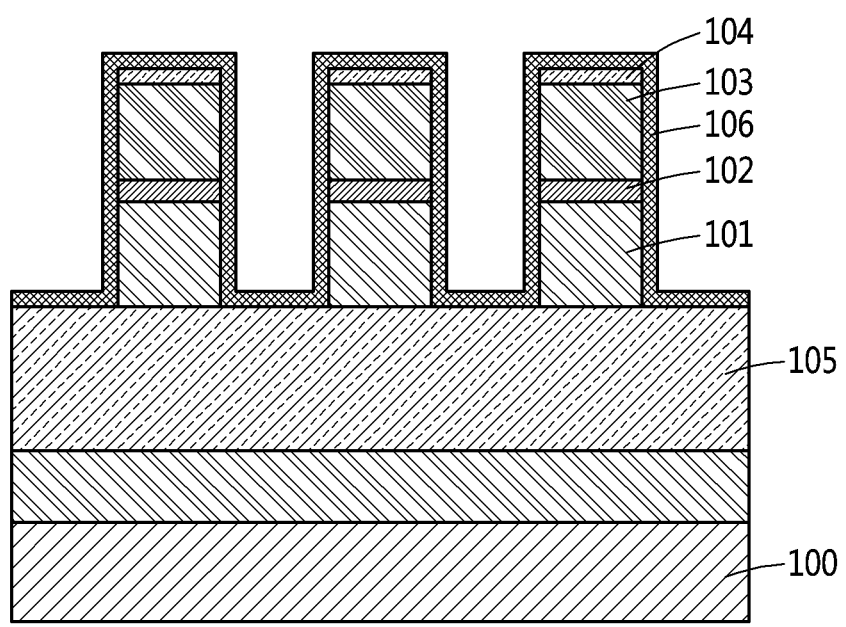
FIGS. 1a to 1h illustrate a nanorod LED according to an embodiment of the present disclosure and a method of fabricating the same.

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," " . . . enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

Hereinafter, the terms, such as 'unit' or 'module', etc., should be understood as a unit that processes at least one function or operation and that may be embodied in a hardware manner, a software manner, or a combination of the hardware manner and the software manner.

FIGS. 1*a* to 1*h* illustrate a nanorod LED according to an embodiment of the present disclosure and a method of fabricating the same.

FIGS. 1*a* to 1*h* sequentially illustrate the method of fabricating the nanorod LED according to an embodiment of the present disclosure.

More particularly, FIGS. 1*a* to 1*d* illustrate an embodiment of forming a first conductor layer on a first semiconductor layer by the method of fabricating the nanorod LED according to an embodiment of the present disclosure, and FIGS. 1*e* to 1*h* illustrate an embodiment of forming a second conductor layer on a second semiconductor layer after formation of the first conductor layer. Hereinafter, an embodiment of forming the second conductor layer after formation of the first conductor layer is described. However, the order of formation of the first conductor layer and the second conductor layer may be changed. In addition, only the first conductor layer may be formed, and the second conductor layer may not be formed.

Referring to FIG. 1*a*, the method of fabricating the nanorod LED according to an embodiment of the present disclosure includes sequentially forming a second semiconductor layer 101, a multi-quantum well structure layer 102; and forming a first deposition prevention layer 105 such that a first semiconductor layer 103 and a first ohmic contact layer 104 on a substrate 100 and such that second semiconductor layer 101 is partially covered.

By the method of fabricating the nanorod LED according to an embodiment of the present disclosure, an insulating material is coated on the first deposition prevention layer 105, so that a passivation layer 106 is formed on the multi-quantum well structure layer 102.

For example, the insulating material may include at least one of $Al_2O_3$, $SiO_2$, and AlN.

For example, the passivation layer 106 may be made of at least one dielectric material selected from among $Al_2O_3$, $SiO_2$, $SiN_x$, SiONe, $ZrO_2$ and $HfO_2$ to form a dielectric layer.

For example, the first semiconductor layer 103 may be a gallium nitride (GaN) semiconductor layer (p-GaN) doped with a p-type impurity and may serve to supply holes.

For example, the second semiconductor layer 101 may be a gallium nitride (GaN) semiconductor layer (n-GaN) doped with an n-type impurity and may serve to supply electrons.

For example, the nanorod LED fabrication method includes forming the passivation layer 106 to physically passivate the multi-quantum well structure layer 102.

Accordingly, the nanorod LED according to an embodiment of the present disclosure may prevent the occurrence of leakage current.

Figure 1B:
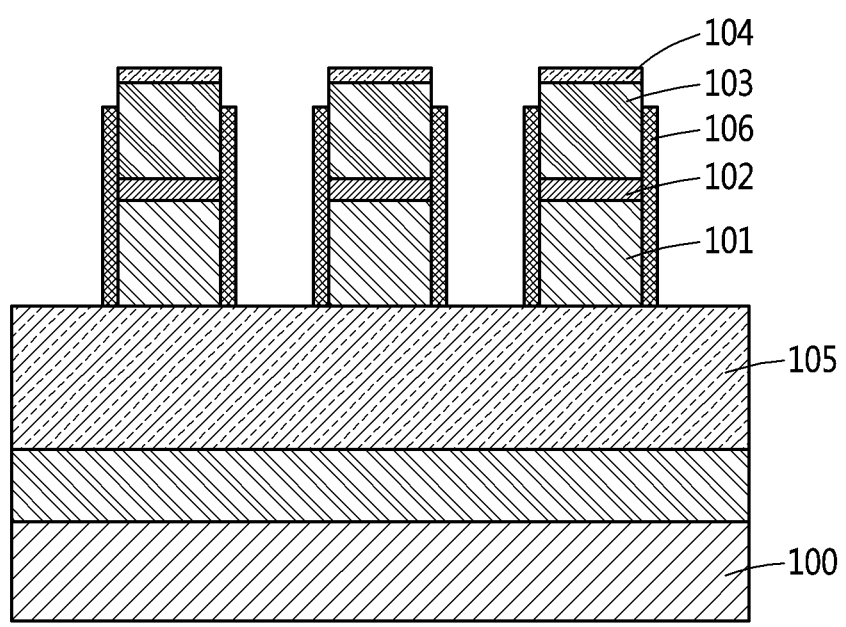

Referring to FIG. 1*b*, the method of fabricating the nanorod LED according to an embodiment of the present disclosure includes partially removing the passivation layer 106 formed on the first ohmic contact layer 104 by a method of etching an insulating film.

For example, the nanorod LED fabrication method may include etching the passivation layer 106 coated on the first ohmic contact layer 104.

That is, by the nanorod LED fabrication method, a region on which a first conductor layer is to be formed is selectively etched.

For example, by the nanorod LED fabrication method, the first conductor layer may be formed on the first semiconductor layer 103 also when the first ohmic contact layer 104 is not formed.

Figure 1C:
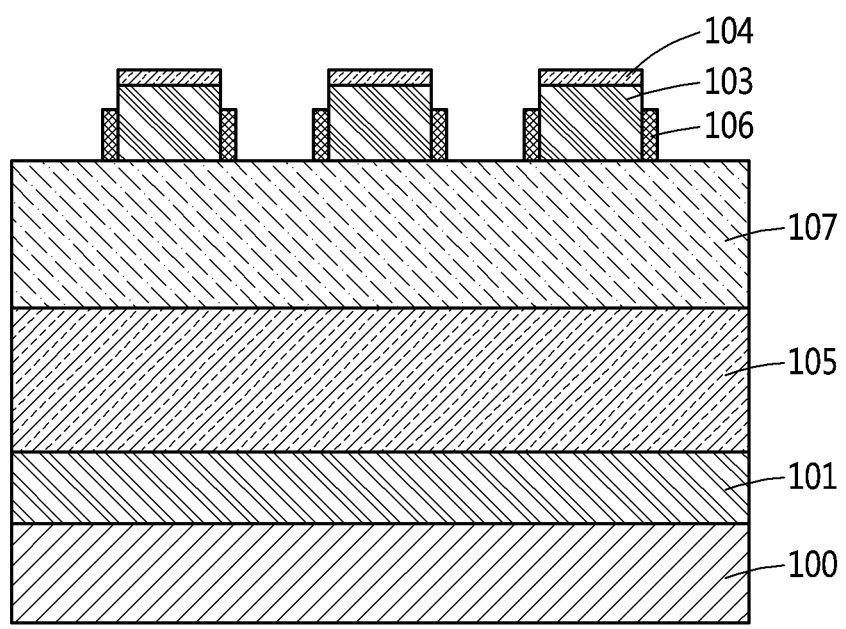

Referring to FIG. 1c, the method of fabricating the nanorod LED according to an embodiment of the present disclosure includes additionally coating a second deposition prevention layer 107 on the first deposition prevention layer 105 to perform a conductor deposition process of forming the first conductor layer.

For example, the nanorod LED fabrication method includes forming the second deposition prevention layer 107, which is related to conductor deposition, on the first deposition prevention layer 105.

Figure 1D:
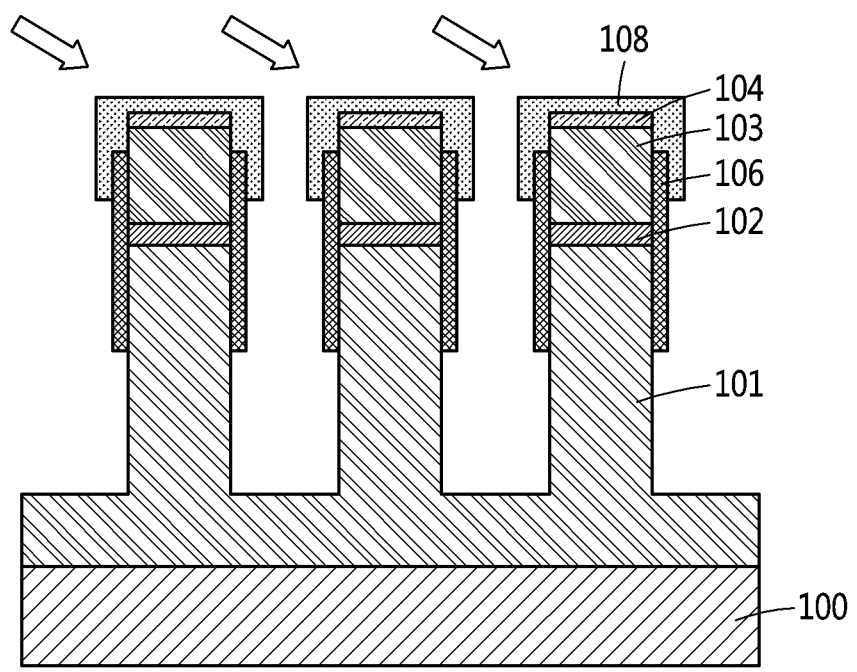

Referring to FIG. 1d, the method of fabricating the nanorod LED according to an embodiment of the present disclosure includes depositing a conductor on the first ohmic contact layer 104 to form a first conductor layer 108 with various shapes.

For example, the first conductor layer 108 may be formed in any one shape of a shape inclined to one side, a shape parallel to the first ohmic contact layer 104 and a zigzag shape. Specific shapes of the first conductor layer 108 are more particularly described with reference to FIGS. 2a to 2c.

For example, when the first ohmic contact layer 104 is not formed, the first conductor layer 108 may be formed in any one shape of a shape parallel to the first semiconductor layer 103 and a zigzag shape.

For example, the parallel shape refers to a shape wherein the first conductor layer 108 is formed parallel to the first semiconductor layer 103. Here, the first conductor layer 108 may be formed on the entire upper surface of the first semiconductor layer 103 or on a portion of a surface thereof.

For example, the nanorod LED fabrication method includes performing an annealing process of forming the first conductor layer 108 after depositing a conductor on the first ohmic contact layer 104.

In addition, the nanorod LED fabrication method includes removing the first deposition prevention layer 105 and the second deposition prevention layer 107 before the annealing process after completing the conductor deposition process of forming the first conductor layer 108.

For example, the first deposition prevention layer 105 and the second deposition prevention layer 107 may be layers that prevent the deposition of Spin on Glass (SOG), resin, and the like and are easily removed.

The method of fabricating the nanorod LED according to an embodiment of the present disclosure includes physically passivating the multi-quantum well structure layer 102 before separating the nanorod from the substrate to prevent current leakage.

In addition, by the nanorod LED fabrication method, an ohmic contact is preferentially performed on the first semiconductor layer 103, and a deposition process, such as an atomic layer deposition (ALD), performed after separating and aligning the nanorod LED from the substrate is not additionally required.

In addition, since high temperature is not required in an annealing process, higher current injection efficiency may be expected.

In other words, by the nanorod LED fabrication method, the process of forming the first ohmic contact layer 104 and the first conductor layer 108 on the first semiconductor layer 103 is preferentially performed, and the nanorod LED is separated and aligned from the substrate later, so that an additional deposition process may not be required.

By the nanorod LED fabrication method of the present disclosure, the length and shape of the first conductor layer 108 are controlled such that the multi-quantum well structure layer 102 is disposed between two electrodes of the electrode pattern when the conductor layer of the nanorod LED is aligned on the electrode pattern.

In other words, by the nanorod LED fabrication method, the length and shape of the first conductor layer 108 are controlled on the first semiconductor layer 103 or the first ohmic contact layer 104 such that the multi-quantum well structure layer 102 is disposed within the width of an unpatterned region.

Accordingly, the conductor layer of the present disclosure may be formed on at least one of the first and second semiconductor layers while minimizing the stress of the multi-quantum well structure layer, thinly forming the first semiconductor layer to increase quantum efficiency, and controlling the length and shape of the conductor layer, thereby preventing the occurrence of electrical short.

Figure 1E:
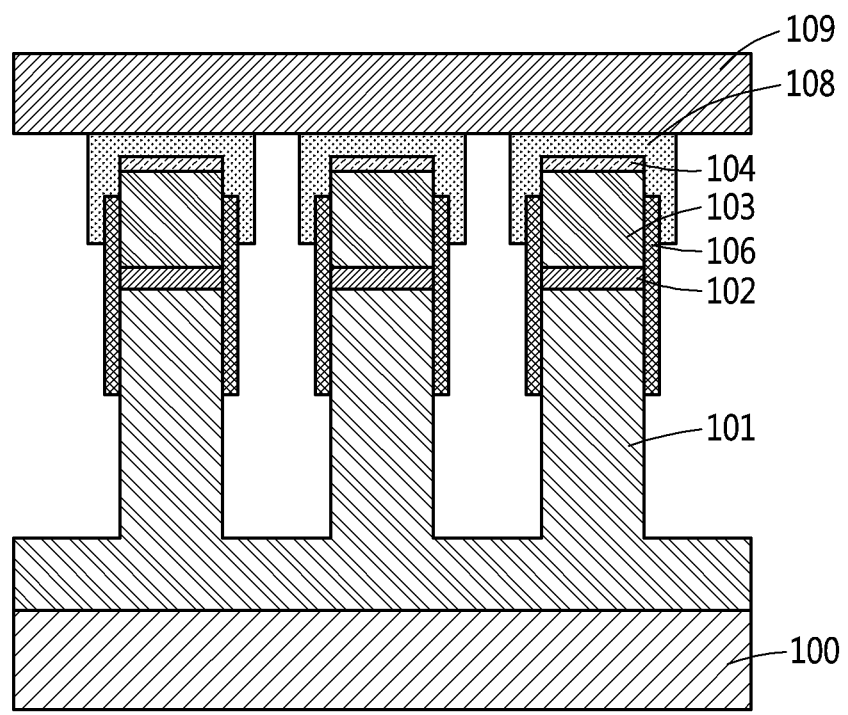

Referring to FIG. 1e, the method of fabricating the nanorod LED according to an embodiment of the present disclosure includes placing a receptor 109 on the first conductor layer 108 to form a second ohmic contact layer and second conductor layer also on the second semiconductor layer 101.

Figure 1F:
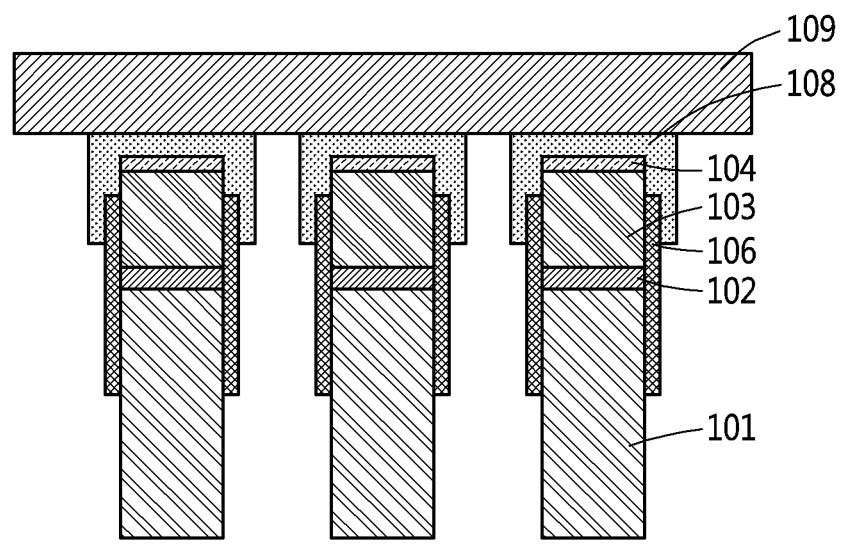

Referring to FIG. 1f, the method of fabricating the nanorod LED according to an embodiment of the present disclosure includes lifting-off the substrate 100 using the receptor 109.

In addition, the nanorod LED fabrication method includes etching the second semiconductor layer 101 such that an upper part of the second semiconductor layer 101 is exposed.

In accordance with an embodiment of the present disclosure, the nanorod LED fabrication method may include forming a second ohmic contact layer 110 on the second semiconductor layer 101.

Figure 1G:
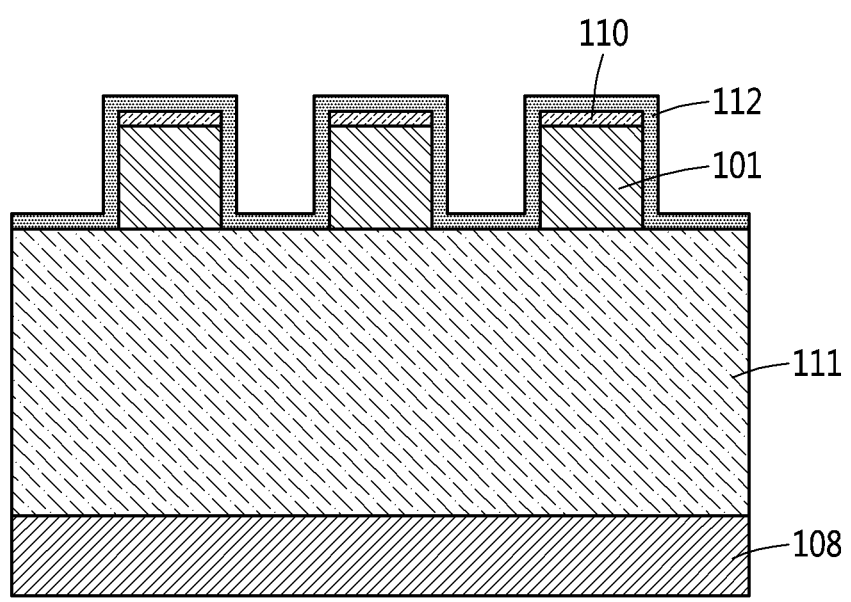

Referring to FIG. 1g, the nanorod LED fabrication method may include forming a third deposition prevention layer 111 on the remaining region except for a region, on which a second conductor layer 112 is to be formed, of the second ohmic contact layer 110, in accordance with an embodiment of the present disclosure.

Figure 1H:
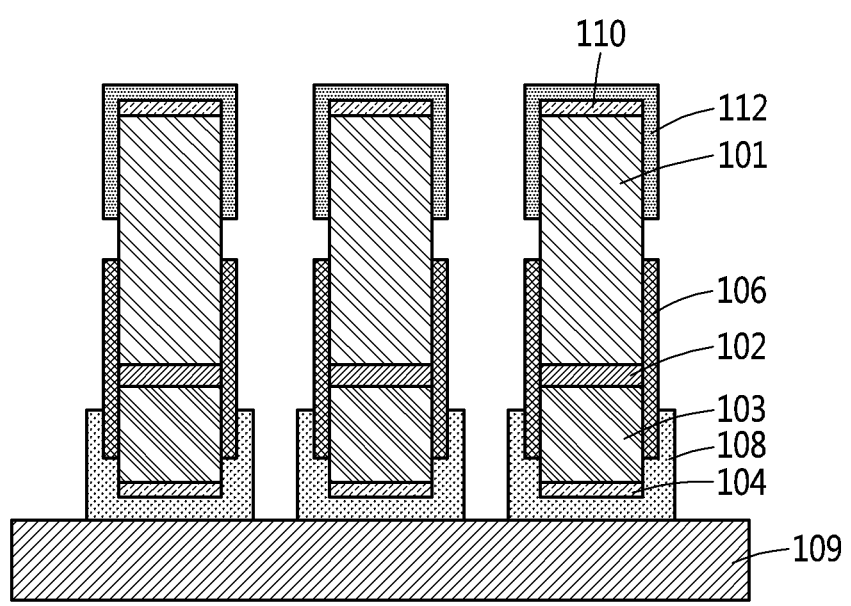

Referring to FIG. 1h, the method of fabricating the nanorod LED according to an embodiment of the present disclosure includes depositing a conductor on the second semiconductor layer 101 to form a second conductor layer 112 with various shapes.

For example, the second conductor layer 112 may be formed in any one shape of a shape inclined to one side, a shape parallel to the second ohmic contact layer 110, and a zigzag shape. A specific shape thereof is more particularly described below with reference to FIGS. 3a to 3c.

In accordance with an embodiment of the present disclosure, the nanorod LED fabrication method includes depositing the second conductor layer 112 on the second semiconductor layer 101 when the second ohmic contact layer 110 is not formed.

Meanwhile, the length and shape of the second conductor layer 112 may be controlled to be disposed between two electrodes of the pattern of the multi-quantum well structure layer 102.

For example, the nanorod LED fabrication method includes performing an annealing process of forming the second conductor layer 112 after depositing a conductor on the second ohmic contact layer 110.

In addition, the nanorod LED fabrication method includes removing the third deposition prevention layer 111 before the annealing process after completing the conductor deposition process of forming the second conductor layer 112.

In accordance with an embodiment of the present disclosure, the nanorod LED fabrication method may provide a nanorod LED including the first conductor layer 108 and second conductor layer 112 that are respectively formed on opposite sides of the first semiconductor layer 103 and the second semiconductor layer 101.

The nanorod LED according to an embodiment of the present disclosure includes a passivation layer 106 that is formed on opposite sides of the first semiconductor layer 103, the multi-quantum well structure layer 102, the second semiconductor layer 101, the first semiconductor layer 103, the multi-quantum well structure layer 102, and the second semiconductor layer 101.

For example, the multi-quantum well structure layer 102 may also be referred to as a multiple quantum well (MQW) layer or an active layer.

In addition, the first conductor layer 108 may be formed, in any one shape of a shape inclined to one side, a shape parallel to the first semiconductor layer 103 and a zigzag shape, on the first semiconductor layer 103 of the nanorod LED.

In addition, after the first conductor layer 108 is formed on the first semiconductor layer 103, the second conductor layer 112 may be formed, in any one shape of a shape inclined to one side, a shape parallel to the second semiconductor layer 101 and a zigzag shape, on the second semiconductor layer 101 of the nanorod LED.

For example, when the first ohmic contact layer 104 is formed on the first semiconductor layer 103 of the nanorod LED, the first conductor layer 108 is formed on the first ohmic contact layer 104.

For example, when the second ohmic contact layer 110 is formed on the second semiconductor layer 101 of the nanorod LED, the second conductor layer 112 is formed on the second ohmic contact layer 110.

In accordance with an embodiment of the present disclosure, the second semiconductor layer 101, the multi-quantum well structure layer 102 and the first semiconductor layer 103 of the nanorod LED may be sequentially formed with respect to the substrate to form a vertical structure.

In accordance with an embodiment of the present disclosure, a nanorod LED is formed on a first substrate for forming a nanorod LED, and then may be aligned on a second substrate which is to be separated from the first substrate and into which a pattern is to be inserted.

In accordance with an embodiment of the present disclosure, the first and second conductor layers 108 and 112 may be formed of at least one conductive material of indium tin oxide (ITO) and metal materials.

In addition, the first and second conductor layers 108 and 112 may be deposited by at least one of an electroplating method, a sputtering method and a thermal evaporation method.

For example, the first semiconductor layer 103 is a p-type impurity-doped gallium nitride (GaN) semiconductor layer (p-GaN) and serves to supply holes, and the second semiconductor layer 101 is an n-type impurity-doped gallium nitride (GaN) semiconductor layer (n-GaN) and serves to supply electrons.

For example, the multi-quantum well structure layer 102 may be composed of a quantum barrier layer, an active layer, and the like.

Accordingly, the present disclosure may efficiently align a GaN nanorod LED on various patterns with two electrodes by forming a conductor layer with various shapes on the GaN nanorod LED, and may efficiently inject current thereto.

In addition, the present disclosure preferentially forms an ohmic contact layer and a conductor layer before separating the GaN nanorod LED from the substrate, thereby forming an electrode contact with a relatively large area on the first and second semiconductor layers.

In the above description, it was exemplified that the first ohmic contact layer and the first conductor layer are formed on the first semiconductor layer, the length and shape of the first conductor layer are controlled such that, when aligned on various patterns with two electrodes, the active layer is disposed between two electrodes of the electrode pattern, and additionally the length and shape of the second conductor layer are controlled such that the active layer is disposed between two electrodes of the electrode pattern upon aligning on various electrode patterns also when the second ohmic contact layer and the second conductor layer are formed on the second semiconductor layer.

The first ohmic contact layer and the second ohmic contact layer may be selectively formed, and the first conductor layer and the second conductor layer may also be selectively formed.

In the following disclosure, an embodiment of a structure composed of a first ohmic contact layer and a second ohmic contact layer is described, but the first ohmic contact layer and the second ohmic contact layer may be selectively formed.

Figure 2A:
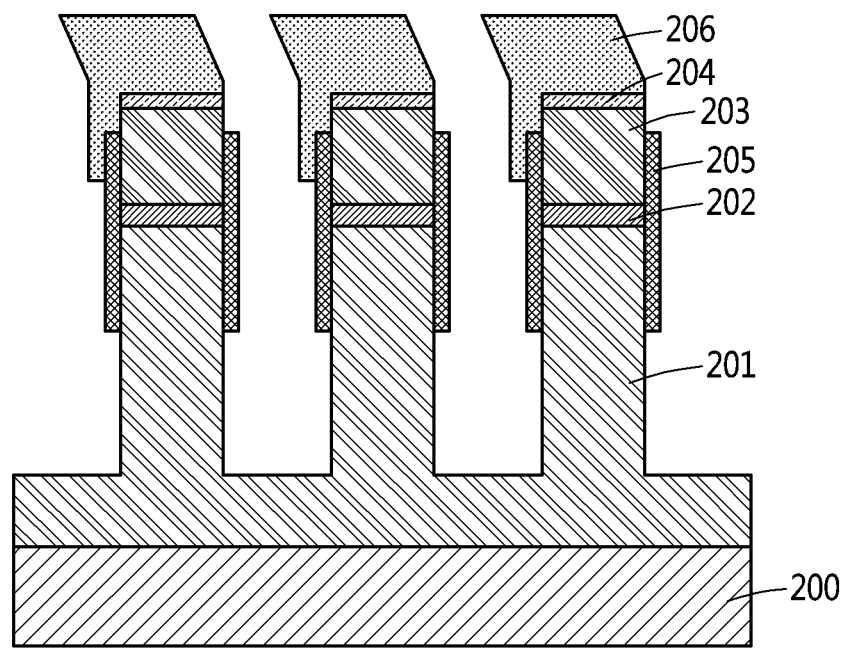
FIGS. 2a to 2c illustrate an embodiment of forming a first conductor layer of a nanorod LED according to an embodiment of the present disclosure.
Figure 2B:
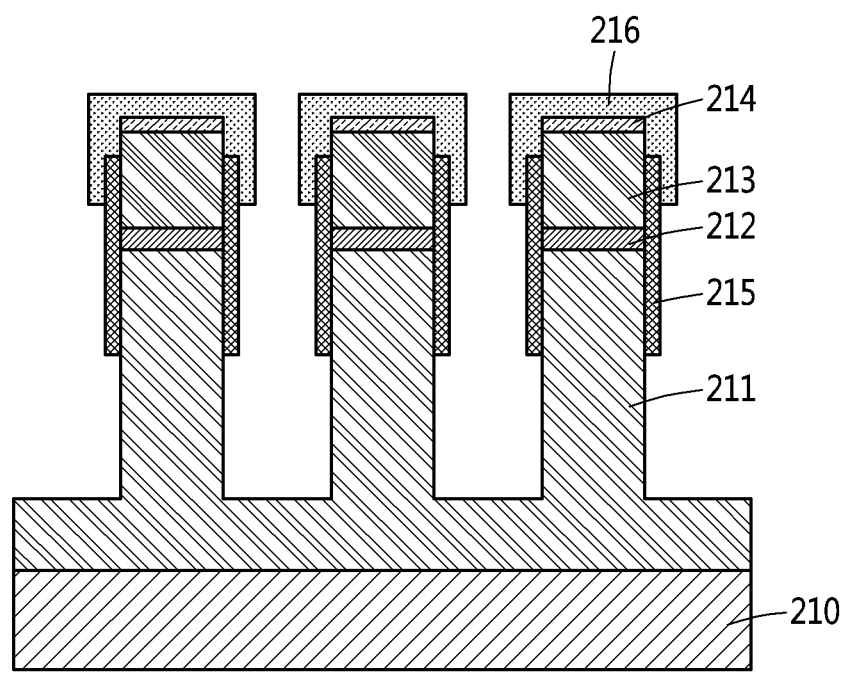
Figure 2C:
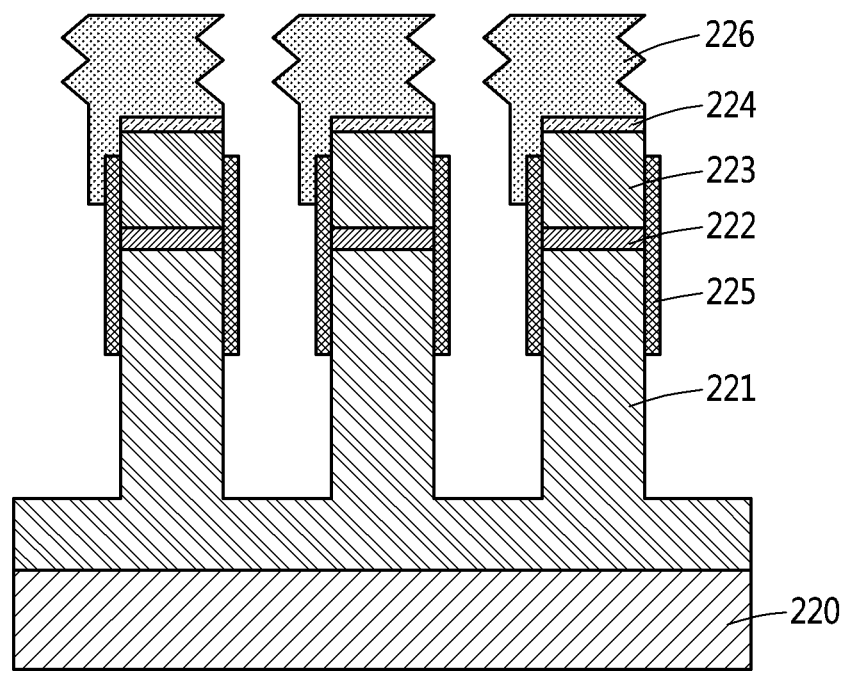

FIGS. 2a to 2c illustrate an embodiment of forming a first conductor layer of a nanorod LED according to an embodiment of the present disclosure.

FIG. 2a illustrates an embodiment of a first conductor layer formed by depositing a conductor in a state in which a nanorod LED fabrication sample is inclined.

Referring to FIG. 2a, the nanorod LED according to an embodiment of the present disclosure includes a substrate 200 and a second semiconductor layer 201, multi-quantum well structure layer 202, first semiconductor layer 203, first ohmic contact layer 204, passivation layer 205 and first conductor layer 206 formed on the substrate 200.

In accordance with an embodiment of the present disclosure, the first conductor layer 206 may have a shape inclined to one side.

For example, by the nanorod LED fabrication method, a first conductor layer 206 having a shape inclined to one side may be formed by depositing a conductor thicker than a reference in a state in which a nanorod LED fabrication sample is inclined to one side.

For example, the thickness of the first conductor layer 206 may be controlled using an electroplating method. For example, the thickness of the first conductor layer 206 may be related to the length of the first conductor layer 206, and, as the thickness of the first conductor layer 206 increases, the length of the first conductor layer 206 also increases.

FIG. 2b illustrates an embodiment of depositing a conductor while rotating a nanorod LED fabrication sample at a constant speed, thereby forming the first conductor layer of the nanorod LED according to an embodiment of the present disclosure.

Referring to FIG. 2b, the nanorod LED according to an embodiment of the present disclosure includes a substrate 210 and a second semiconductor layer 211, multi-quantum well structure layer 212, first semiconductor layer 213, first ohmic contact layer 214, passivation layer 215 and first conductor layer 216 formed on the substrate 210.

In accordance with an embodiment of the present disclosure, the first conductor layer 216 may have a thin thickness and may have a shape of covering the entire upper surface of the first ohmic contact layer 214.

For example, when the first ohmic contact layer 214 is not formed, the first conductor layer 216 may be formed to cover the entire upper surface of the first semiconductor layer 213.

For example, the nanorod LED fabrication method includes depositing a conductor thinner than a reference in a state in which a nanorod LED fabrication sample rotates, thereby forming the first conductor layer 216 having a shape parallel to the first ohmic contact layer 214.

FIG. 2c illustrates an embodiment of thickly depositing a conductor in a state, in which a nanorod LED fabrication sample rotates, to form the first conductor layer of the nanorod LED according to an embodiment of the present disclosure.

Referring to FIG. 2c, the nanorod LED according to an embodiment of the present disclosure includes a substrate 220, and a second semiconductor layer 221, multi-quantum well structure layer 222, first semiconductor layer 223, first ohmic contact layer 224, passivation layer 225 and first conductor layer 226 formed on the substrate 220.

In accordance with an embodiment of the present disclosure, the first conductor layer 226 may have a zigzag shape.

For example, the nanorod LED fabrication method may include depositing a conductor thicker than a reference in a state, in which a nanorod LED fabrication sample rotates, to form a first conductor layer 226 having a zigzag shape.

In accordance with an embodiment of the present disclosure, since the criterion for depositing the conductor is related to the degree of covering an upper part of the first semiconductor layer, the thicknesses of the first conductor layers respectively illustrated in FIGS. 2a and 2c are larger than a reference, and the thickness of the first conductor layer illustrated in FIG. 2b is smaller than the reference, the reference may be a value between the thicknesses of the first conductor layers 205 and 225 and the thickness of the first conductor layer 215.

In addition, the thickness of the first conductor layer is correlated with the deposition time of the conductor.

Figure 3A:
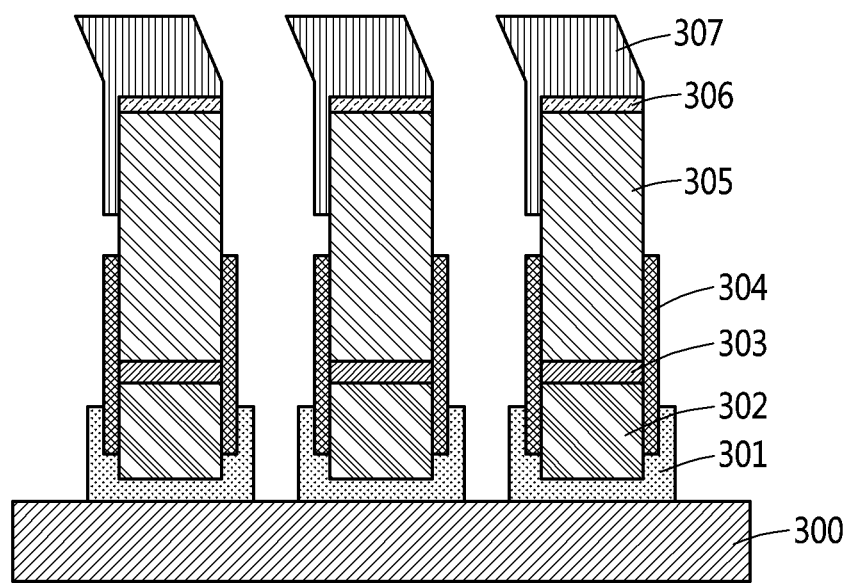
FIGS. 3a to 3c illustrate an embodiment of forming a second conductor layer of a nanorod LED according to an embodiment of the present disclosure.
Figure 3B:
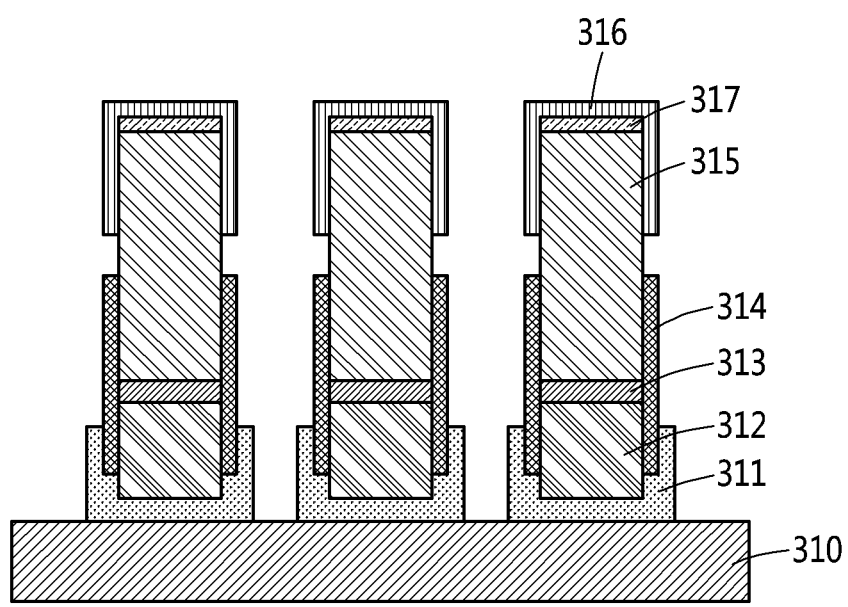
Figure 3C:
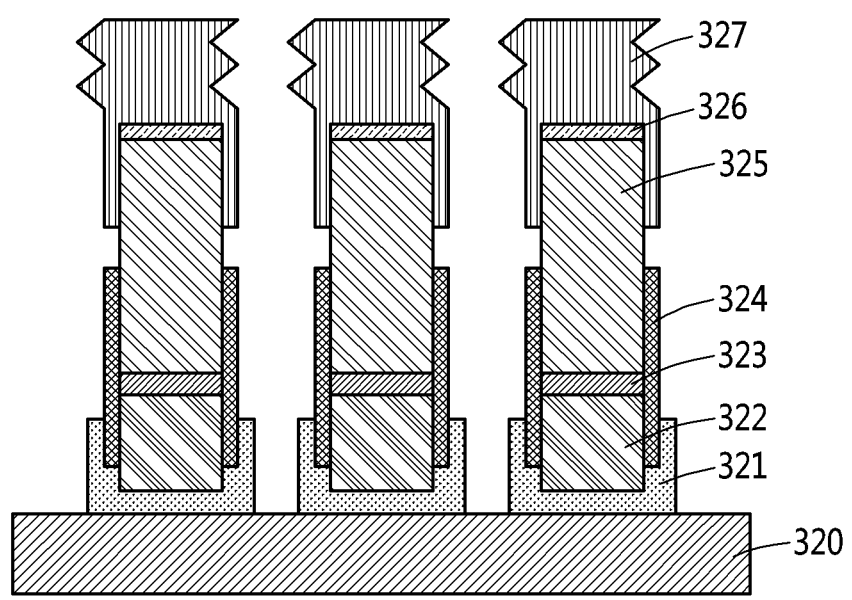

FIGS. 3a to 3c illustrate an embodiment of forming a second conductor layer of a nanorod LED according to an embodiment of the present disclosure.

FIG. 3a illustrates an embodiment of a second conductor layer formed by depositing a conductor in a state in which a nanorod LED fabrication sample is inclined.

Referring to FIG. 3a, the nanorod LED according to an embodiment of the present disclosure includes a receptor 300, and a first conductor layer 301, first semiconductor layer 302, multi-quantum well structure layer 303, passivation layer 304, second semiconductor layer 305, second ohmic contact layer 306 and second conductor layer 307 formed on the receptor 300.

In accordance with an embodiment of the present disclosure, the second conductor layer 307 may have a shape inclined to one side.

For example, by the nanorod LED fabrication method, a second conductor layer 307 having a shape inclined to one side may be formed by depositing a conductor thicker than a reference in a state in which a nanorod LED fabrication sample is inclined to one side.

For example, the thickness of the second conductor layer 307 may be controlled using an electroplating method.

FIG. 3b illustrates an embodiment of depositing a conductor while rotating a nanorod LED fabrication sample at a constant speed, thereby forming the second conductor layer of the nanorod LED according to an embodiment of the present disclosure.

Referring to FIG. 3b, the nanorod LED according to an embodiment of the present disclosure includes a receptor 310, and a first ohmic contact layer 311, first semiconductor layer 312, multi-quantum well structure layer 313, passivation layer 314, second semiconductor layer 315, second ohmic contact layer 316 and second conductor layer 317 formed on the receptor 310.

In accordance with an embodiment of the present disclosure, the second conductor layer 317 may have a thin thickness and may have a shape of covering the entire upper surface of the second semiconductor layer 315.

For example, the nanorod LED fabrication method includes depositing a conductor thinner than a reference in a state in which a nanorod LED fabrication sample rotates, thereby forming the second conductor layer 317 having a shape parallel to the second ohmic contact layer 316.

FIG. 3c illustrates an embodiment of thickly depositing a conductor in a state, in which a nanorod LED fabrication sample rotates, to form the second conductor layer of the nanorod LED according to an embodiment of the present disclosure.

Referring to FIG. 3c, the nanorod LED according to an embodiment of the present disclosure includes a receptor 320, and a first ohmic contact layer 321, first semiconductor layer 322, multi-quantum well structure layer 323, passivation layer 324, second semiconductor layer 325, second ohmic contact layer 326 and second conductor layer 327 formed on the receptor 320.

In accordance with an embodiment of the present disclosure, the second conductor layer 327 may have a zigzag shape.

For example, the nanorod LED fabrication method may include depositing a conductor thicker than a reference in a state, in which a nanorod LED fabrication sample rotates, to form a second conductor layer 327 having a zigzag shape.

In accordance with an embodiment of the present disclosure, since the criterion for depositing the conductor is related to the degree of covering an upper part of the second ohmic contact layer, the thicknesses of the second conductor layers respectively illustrated in FIGS. 3a and 3c are larger than a reference, and the thickness of the second conductor layer illustrated in FIG. 3b is smaller than the reference, the reference may be a value between the thicknesses of the second conductor layers 307 and 327 and the thickness of the second conductor layer 317.

In addition, the thickness of the second conductor layer is correlated with the deposition time of the conductor.

In accordance with an embodiment of the present disclosure, the nanorod LED may include a conductor layer formed on at least one of the first and the second semiconductor layers.

In other words, the nanorod LED may include a conductor layer selectively formed on any one of the first and second semiconductor layers.

For example, the first conductor layer may be formed on the first semiconductor layer of the nanorod LED, or a second conductor layer may be formed on the second semiconductor layer of the nanorod LED.

In other words, the nanorod LED may be formed in a structure of including both the first conductor layer and the second conductor layer, a structure of including only the first conductor layer, or a structure of including only the second conductor layer.

Figure 4A:
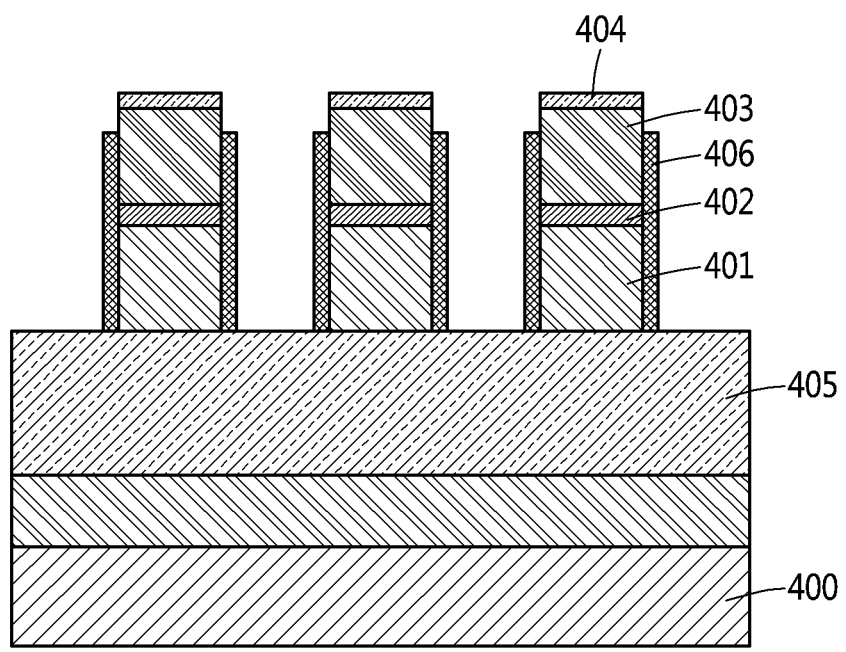
FIGS. 4a to 4c illustrate an embodiment of forming a transparent electrode of a nanorod LED according to an embodiment of the present disclosure.
Figure 4B:
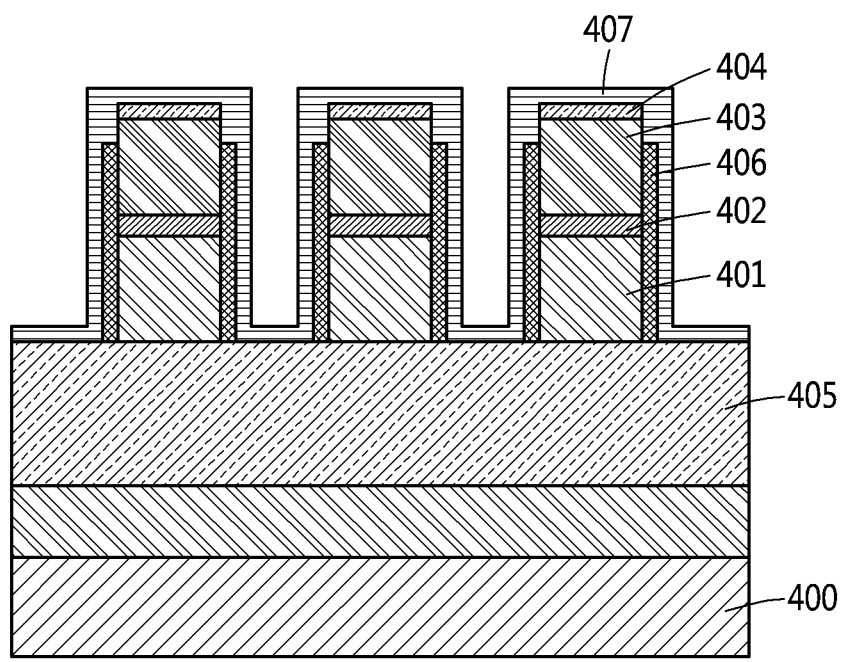
Figure 4C:
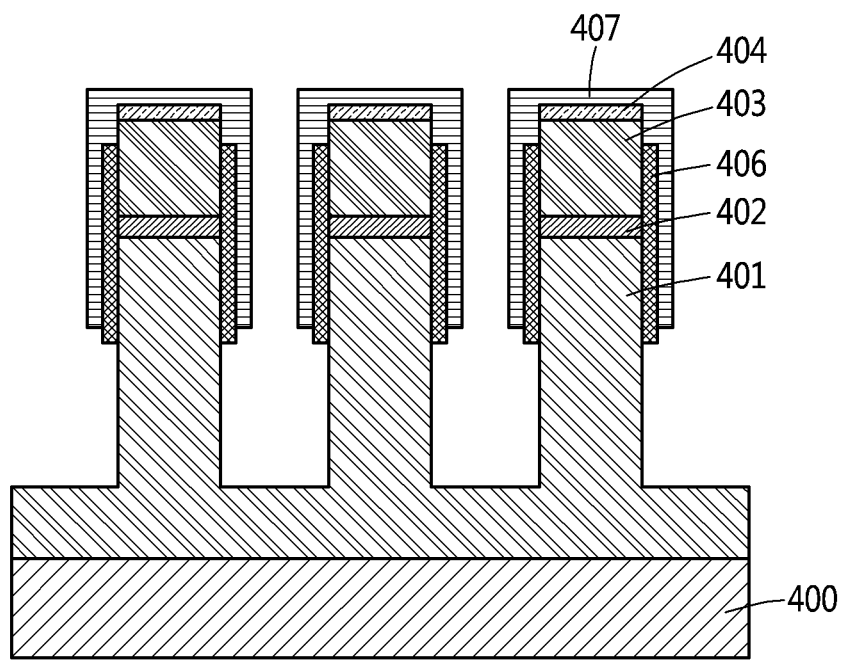

FIGS. 4a to 4c illustrate an embodiment of forming a transparent electrode of a nanorod LED according to an embodiment of the present disclosure.

FIGS. 4a to 4c illustrate an embodiment of depositing an insulating film and, after exposing an upper part of a first ohmic contact layer, directly depositing a transparent electrode on a first semiconductor layer, without secondary deposition prevention layer coating.

Referring to FIG. 4a, the method of fabricating the nanorod LED according to an embodiment of the present disclosure includes forming a second semiconductor layer 401, a multi-quantum well structure layer 402 and a first semiconductor layer 403 on a substrate 400, forming a passivation layer 406 to passivate the multi-quantum well structure layer 402, and partially removing the passivation layer 406, formed on an upper part of the first semiconductor layer 403, using a method of etching an insulating film.

Here, a first ohmic contact layer 404 may be formed on the first semiconductor layer 403.

That is, the passivation layer 406 may be formed after the second semiconductor layer 401, the multi-quantum well structure layer 402 and the first semiconductor layer 403 are sequentially formed, and then the first ohmic contact layer 404 is formed, and then the deposition prevention layer 405 is formed.

For example, the nanorod LED fabrication method may include etching the passivation layer 406 coated on the first semiconductor layer 403.

That is, by the nanorod LED fabrication method, a region in which a transparent electrode is to be formed is selectively etched.

Referring to FIG. 4b, the method of fabricating the nanorod LED according to an embodiment of the present disclosure includes coating a transparent electrode-forming material on the deposition prevention layer 405.

For example, the transparent electrode-forming material may include a metal material such as ZnO, AZO and ITO.

For example, the passivation layer 406 mutually passivates the transparent electrode, the second semiconductor layer 401 and the multi-quantum well structure layer 402.

Referring to FIG. 4c, the method of fabricating the nanorod LED according to an embodiment of the present disclosure includes removing the deposition prevention layer 405, and performing heat treatment in a state in which the transparent electrode-forming material is coated on the first ohmic contact layer 104 to form a transparent electrode 407.

Figure 5:
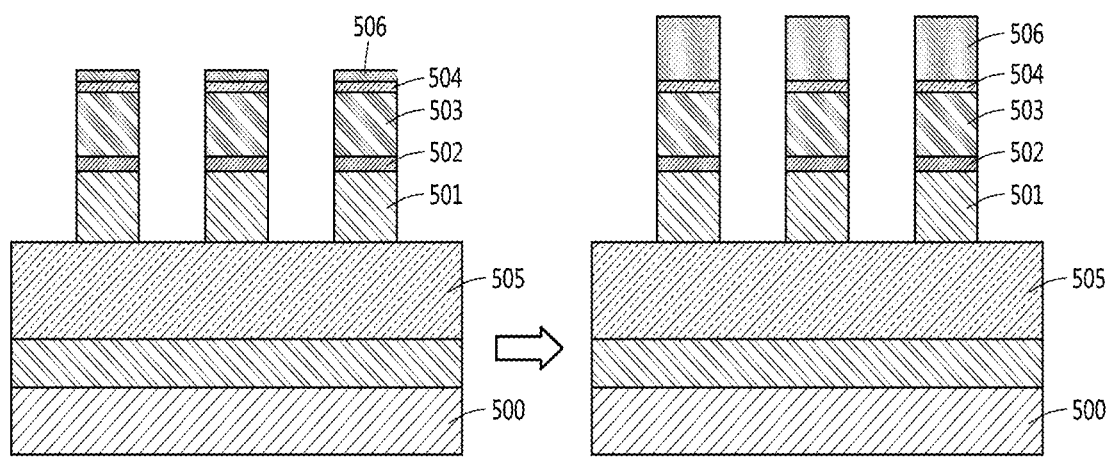
FIG. 5 illustrates an embodiment of controlling the thickness of a conductor layer of a nanorod LED according to an embodiment of the present disclosure using electroplating.

FIG. 5 illustrates an embodiment of controlling the thickness of a conductor layer of a nanorod LED according to an embodiment of the present disclosure using electroplating.

Referring to FIG. 5, the nanorod LED fabrication method includes laminating a seed layer 506 for electroplating on a first ohmic contact layer 504 in a state in which a second semiconductor layer 501, a multi-quantum well structure layer 502, a first semiconductor layer 503 and a first ohmic contact layer 504 are formed on a substrate 500.

For example, the seed layer 506 is formed on the first ohmic contact layer 504 before dry etching for forming a nanorod LED to form the seed layer 506, so that the thickness of the seed layer 506 may be controlled through electroplating after forming a nanorod LED in a subsequent process.

Meanwhile, a deposition prevention layer 505 for forming a passivation layer may be formed after forming the metal layer 506.

The seed layer 506 on the left and the seed layer 506 on the right illustrate an increase in the thickness of the seed layer through electroplating.

For example, the seed layer 506, whose thickness is controlled through electroplating, may be referred to as a metal head and may also be referred to as an electroplated seed layer.

That is, the nanorod LED fabrication method may include sequentially forming an ohmic contact material and a seed layer for electroplating on the first semiconductor layer, and then thickly forming a conductor layer using electroplating after forming a nanorod LED in a subsequent process.

Accordingly, by the nanorod LED fabrication method, the length (thickness) of the conductor layer may be controlled using electroplating.

Figure 6:
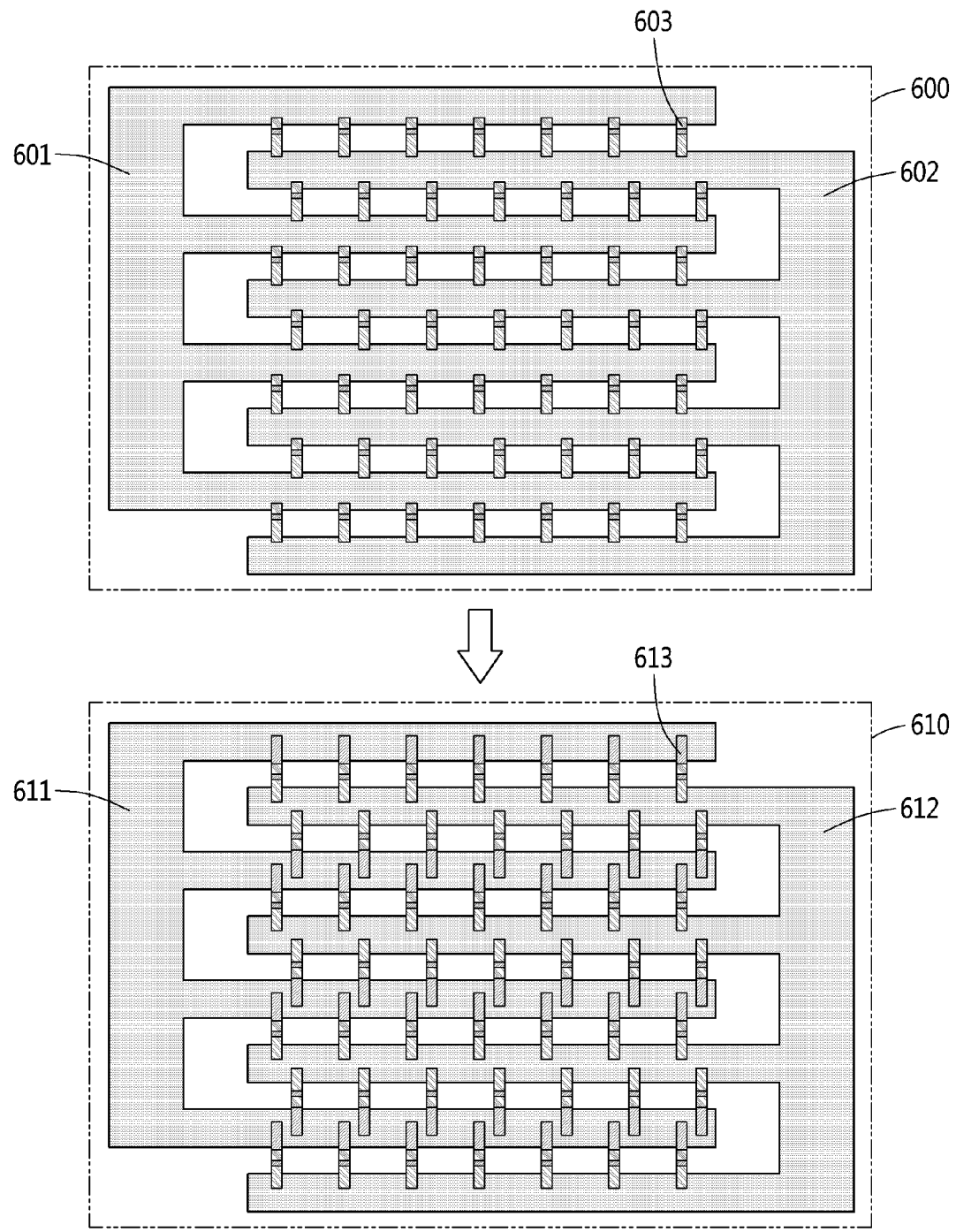
FIG. 6 illustrates a display in which a plurality of nanorod LEDs according to an embodiment of the present disclosure are aligned.

FIG. 6 illustrates a display in which nanorod LEDs according to an embodiment of the present disclosure are aligned.

FIG. 6 exemplifies a display including plurality of nanorod LEDs aligned on an interdigitated (IDT) pattern that includes first and second electrodes.

Referring to FIG. 6, a display 600 according to a conventional technology includes a first electrode 601 and a second electrode 602. Here, a plurality of nanorod LEDs 603 are aligned between the first electrode 601 and the second electrode 602.

Meanwhile, a display 610 according to an embodiment of the present disclosure includes a first electrode 611 and a second electrode 612. Here, a plurality of nanorod LEDs 613 are aligned between the first electrode 611 and the second electrode 612.

The display 600 according to a conventional technology requires an additional process of forming an ohmic contact layer or a conductor layer because an ohmic contact layer or a conductor layer is not separately formed on the nanorod LEDs 603.

Meanwhile, in the case of the display 610 according to an embodiment of the present disclosure, an ohmic contact layer and a conductor layer are previously formed at sites of the nanorod LEDs 613 in contact with the first electrode 611 or the second electrode 612.

In accordance with an embodiment of the present disclosure, the nanorod LEDs 613 includes a first semiconductor layer, a multi-quantum well structure layer, a second semiconductor layer and a passivation layer formed on opposite side surfaces of the first semiconductor layer, the multi-quantum well structure layer and the second semiconductor layer.

In the nanorod LEDs 613 according to an embodiment of the present disclosure, the first conductor layer may be formed on the first semiconductor layer in any one shape of a shape inclined to one side from the top of the first semiconductor layer or the first ohmic contact layer, a shape parallel to the first semiconductor layer or the first ohmic contact layer and a zigzag shape.

In the nanorod LEDs 613 according to an embodiment of the present disclosure, the second conductor layer may be formed on the second semiconductor layer in any one shape of a shape inclined to one side from an upper part of the second semiconductor layer or the second ohmic contact layer, a shape parallel to the second semiconductor layer or the second ohmic contact layer and a zigzag shape.

Meanwhile, in the nanorod LEDs 613, the first conductor layer may be formed on the first semiconductor layer or the first ohmic contact layer, or the first and second conductor layers may be respectively formed on the first and second semiconductor layers or the first and second ohmic contact layers.

In accordance with an embodiment of the present disclosure, the first semiconductor layer may be a p-type impurity-doped gallium nitride (GaN) semiconductor layer (p-GaN) and may serve to supply holes, and the second semiconductor layer may be an n-type impurity-doped gallium nitride (GaN) semiconductor layer (n-GaN) and may serve to supply electrons.

For example, the first electrode may contact the first conductor layer, and the second electrode may contact the second conductor layer.

Accordingly, the present disclosure includes preferentially forming an ohmic contact layer and a conductor layer before separating the GaN nanorod LED from the substrate, so that heat treatment at high temperature performed after aligning nanorods to an IDT pattern may be omitted. Accordingly, a selection range of materials constituting a light emitting diode (LED) display increases.

In addition, by the present disclosure, heat treatment due to unnecessary photolithography may be omitted because an ohmic contact layer is previously formed before aligning GaN nanorod LEDs to an IDT pattern.

Meanwhile, the length and shape of each of the first and second conductor layers may be controlled such that the active layer of the nanorod LED is disposed between the first electrode 611 and the second electrode 612.

An embodiment of controlling the length and shape of the first conductor layer between the first electrode and the second electrode according to the method of fabricating the nanorod LED of an embodiment of the present disclosure is more particularly described with reference to FIG. 7.

Figure 7:
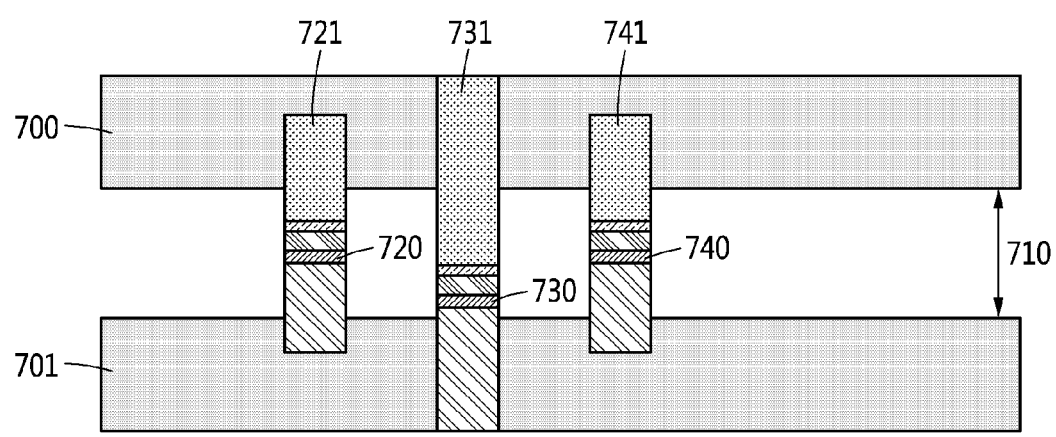
FIG. 7 illustrates an embodiment of controlling the length of a conductor layer of a nanorod LED according to an embodiment of the present disclosure.

FIG. 7 illustrates an embodiment of controlling the length of a conductor layer of a nanorod LED according to an embodiment of the present disclosure.

Referring to FIG. 7, the nanorod LED according to an embodiment of the present disclosure is disposed between a first electrode 700 and second electrode 701 of a pattern. Here, the lengths of a conductor layer 721, a conductor layer 731 and a conductor layer 741 may be controlled such that a multi-quantum well structure layer 720, a multi-quantum well structure layer 730 and a multi-quantum well structure layer 740 can be located in a width 710 between the first electrode 700 and the second electrode 701.

Although the conductor layer 721, the conductor layer 731 and the conductor layer 741 have different lengths, all of the multi-quantum well structure layer 720, the multi-quantum well structure layer 730 and the multi-quantum well structure layer 740 are located in the width 710.

In accordance with an embodiment of the present disclosure, a first semiconductor layer of the nanorod LED is formed in an epi level to minimize the stress of a multi-quantum well structure layer and increase quantum efficiency.

When the thickness of the first semiconductor layer is formed in an epi level, electrical short may occur. Accordingly, it may be necessary to control the length of the conductor layer such that the multi-quantum well structure layer can be located in the width 710.

Accordingly, the method of fabricating the nanorod LED according to an embodiment of the present disclosure includes controlling the thickness (length) of the conductor layer after forming the ohmic contact layer so that the multi-quantum well structure layer can be located in the width 710.

The method of fabricating the nanorod LED according to an embodiment of the present disclosure includes thickly forming the conductor layer on the ohmic contact layer so that the multi-quantum well structure layer can be disposed at the center between two electrodes of the IDT pattern.

In the method of fabricating the nanorod LED according to an embodiment of the present disclosure, the conductor formed on the first semiconductor layer may be made of any material with conductivity including metal and ITO.

Since a junction of a conductor layer formed according to the method corresponds to a junction between an IDT pattern and a metal, a junction with low electrical resistance may be formed.

The nanorod LED according to an embodiment of the present disclosure may be aligned on various patterns without being limited to an IDT pattern. As one example of various patterns, a circle pattern is exemplified and described with reference to FIG. 8.

Figure 8:
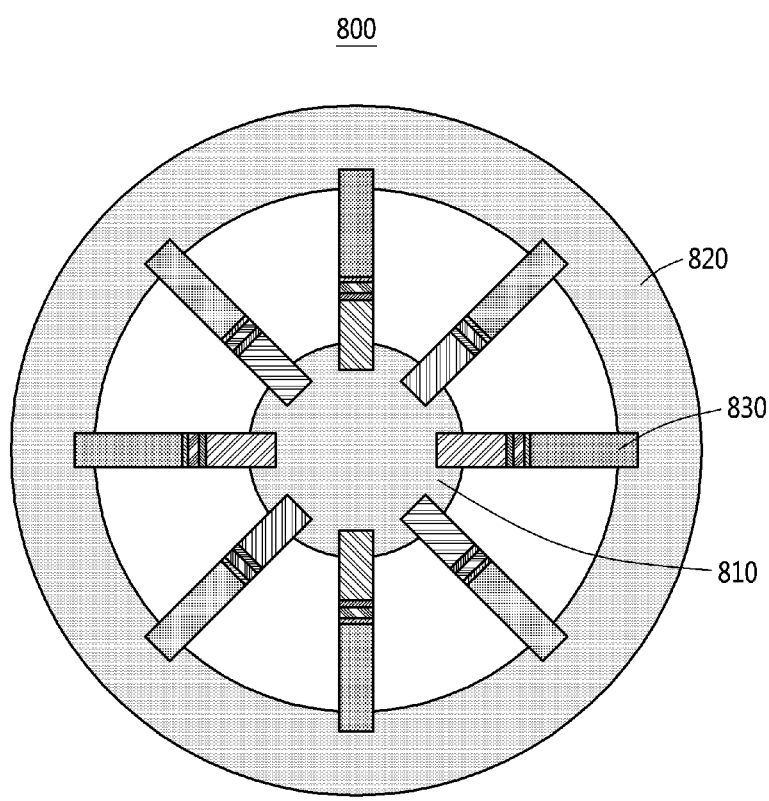
FIG. 8 illustrates an embodiment wherein a plurality of nanorod LEDs are aligned on a circle pattern according to an embodiment of the present disclosure.

FIG. 8 illustrates an embodiment wherein a plurality of nanorod LEDs are aligned on a circle pattern according to an embodiment of the present disclosure.

Referring to FIG. 8, the nanorod LEDs according to an embodiment of the present disclosure may be aligned on a circle pattern 800.

For example, the circle pattern 800 includes a second electrode 810 and a first electrode 820, and a plurality of nanorod LEDs 830 are aligned between the second electrode 810 and the first electrode 820.

In the nanorod LEDs 830 according to an embodiment of the present disclosure, a conductor layer may be formed in a portion in contact with the first electrode 820, and the length and shape of the conductor layer may be controlled such that a multi-quantum well structure layer of each of the nanorod LEDs 830 is located between the second electrode 810 and the first electrode 820.

Figure 9:
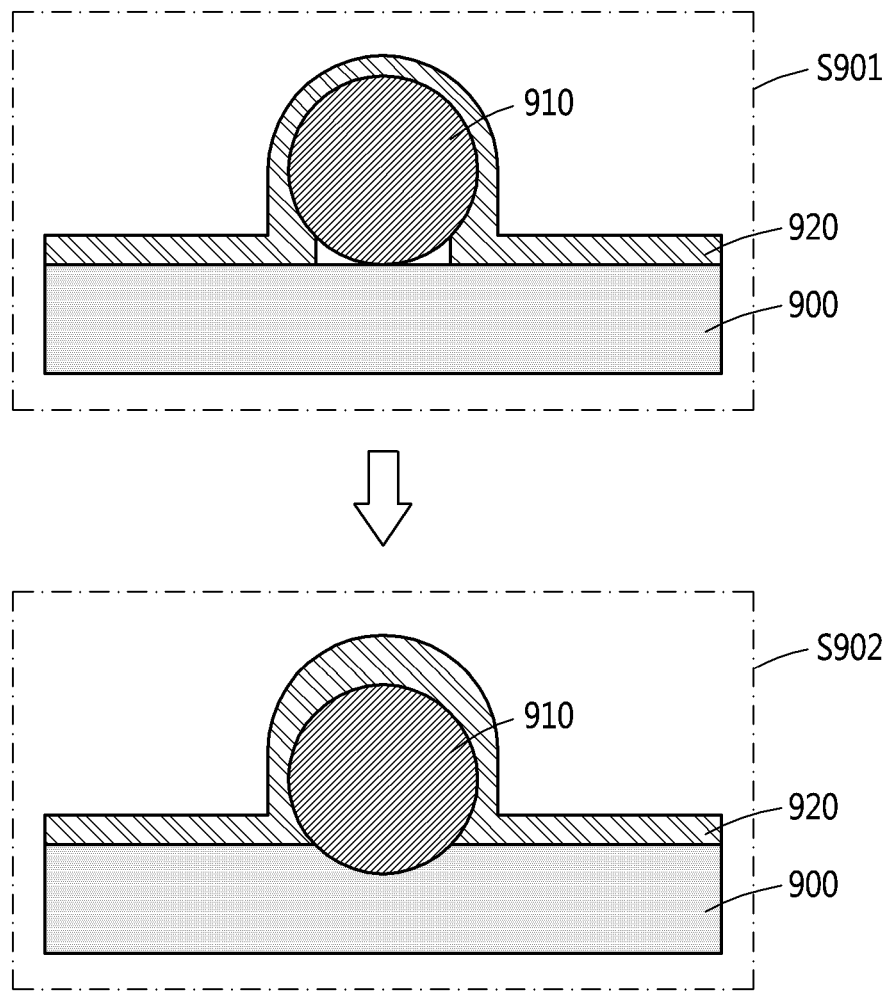
FIGS. 9 and 10 illustrate a method of aligning a nanorod on an IDT pattern according to a conventional technology.
Figure 10:
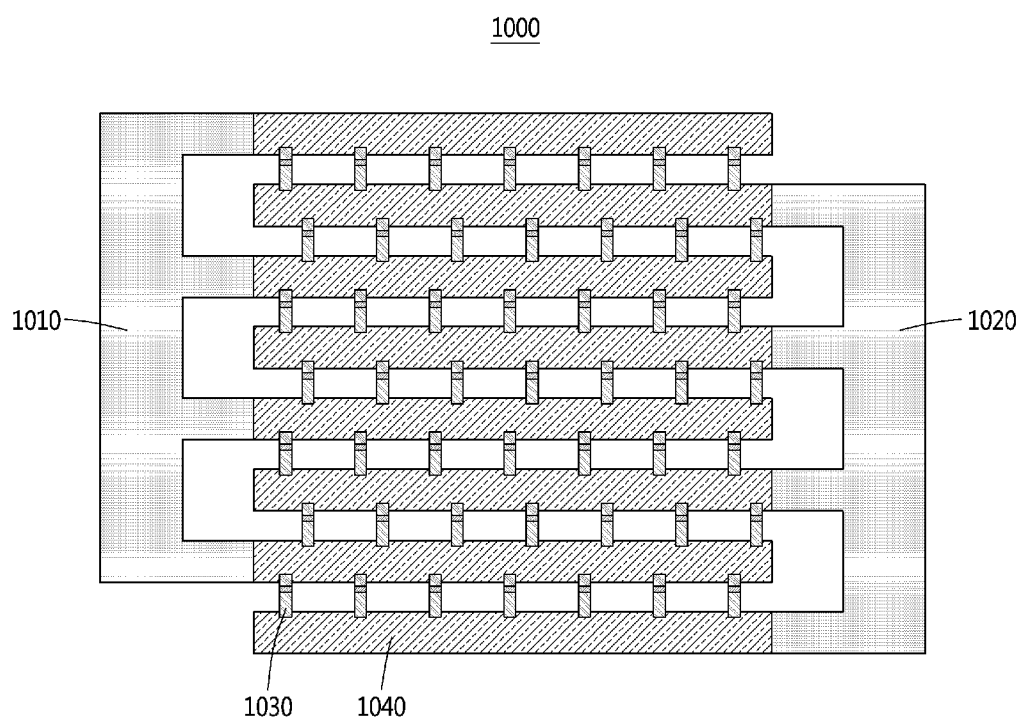

FIGS. 9 and 10 illustrate a method of aligning a nanorod on an IDT pattern according to a conventional technology.

FIG. 9 illustrates a process of aligning a nanorod LED on an IDT pattern according to a conventional technology.

Referring to FIG. 9, in step S901, a nanorod LED 910 is aligned on an IDT pattern 900, and then, after a deposition prevention layer, a conductor 920 is deposited.

In step S902, heat treatment fixation is performed such that the nanorod LED 910 is in contact with the conductor 920 on the IDT pattern 900.

In other words, in the case of a manner of aligning a nanorod LED on an IDT pattern according to a conventional technology, the vicinity of a p-GaN semiconductor layer and an n-GaN semiconductor layer is exposed by a deposition prevention process to fix the nanorod LED after aligning the nanorod LED. To increase coverage for the exposed portions, a conductor is deposited again using ALD.

As a subsequent process, heat treatment should be performed. However, it is difficult to thermally treat PCB or glass at 400° C. or higher. Accordingly, there is a limit in applying a pattern material.

FIG. 10 illustrates a structure formed according to the method of aligning a nanorod LED on an IDT pattern shown in FIG. 9.

Referring to FIG. 10, a display 1000 has a structure wherein a plurality of nanorod LEDs 1030 are aligned between the first electrode 1010 and the second electrode 1020, and a conductor layer 1040 is formed on opposite side surfaces of each of the LEDs 1030.

As described above with reference to FIG. 9, additional heat treatment is required to form the conductor layer 1040, but it is difficult to thermally treat PCB or glass at 400° C. or higher. Accordingly, there is a limit in applying a pattern material.

As apparent from the above description, the present disclosure provides a GaN nanorod LED including a conductor layer with various shapes and lengths, thereby being capable of being efficiently aligned on various patterns and allowing current injection.

The present disclosure can prevent the occurrence of electrical short by thinly forming a first semiconductor layer so as to increase quantum efficiency while minimizing the stress of a multi-quantum well structure layer, and by forming a conductor layer on at least one of the first and second semiconductor layers while controlling the length and shape of the conductor layer.

The present disclosure can form an electrode contact having a relatively large area on first and second semiconductor layers by preferentially forming an ohmic contact layer and a conductor layer before separating a GaN nanorod LED from a substrate.

The present disclosure can omit a heat treatment process, performed at high temperature after aligning nanorods on various patterns, by preferentially forming an ohmic contact layer and a conductor layer before separating a GaN nanorod LED from a substrate, thereby increasing a selection range of materials constituting a light emitting diode (LED) display.

The present disclosure can omit heat treatment accompanying an unnecessary photolithography process by previously forming an ohmic contact layer and a conductor layer before aligning GaN nanorod LEDs on various patterns.

In the aforementioned embodiments, constituents of the present disclosure were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural constituents may be a singular constituent or a singular constituent may be plural constituents.

While the embodiments of the present disclosure have been described, those skilled in the art will appreciate that many modifications and changes can be made to the present disclosure without departing from the spirit and essential characteristics of the present disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

What is claimed is:

1. A nanorod light emitting diode (LED), comprising:
a first semiconductor layer;
a multi-quantum well structure layer;
a second semiconductor layer; and
a conductor layer formed on at least one semiconductor layer of the first semiconductor layer and the second semiconductor layer,
wherein a length and shape of the conductor layer are controlled such that the multi-quantum well structure layer is disposed between two electrodes of the electrode pattern on which the conductor layer is to be aligned.

2. The nanorod LED according to claim 1, further comprising:
an ohmic contact layer formed between the at least one semiconductor layer and the conductor layer; and
a passivation layer formed on opposite side surfaces of the first semiconductor layer, the multi-quantum well structure layer and the second semiconductor layer.

3. The nanorod LED according to claim 1, wherein the conductor layer is formed in any one shape of a shape inclined to one side, a shape parallel to the at least one semiconductor layer and a zigzag shape on the at least one semiconductor layer.

4. The nanorod LED according to claim 2, wherein the conductor layer is formed in any one shape of a shape inclined to one side, a shape parallel to the at least one semiconductor layer and a zigzag shape on the at least one semiconductor layer.

5. The nanorod LED according to claim 1, wherein the electrode pattern comprises at least one electrode pattern of an interdigitated (IDT) pattern and a circle pattern.

6. The nanorod LED according to claim 1, wherein the conductor layer is deposited by at least one method of an electroplating method, a sputtering method and a thermal evaporation method.

7. The nanorod LED according to claim 1, wherein the second semiconductor layer, the multi-quantum well structure layer and the first semiconductor layer are sequentially formed with respect to the substrate to form a vertical structure.

8. The nanorod LED according to claim 1, wherein the first semiconductor layer is a p-type impurity-doped gallium nitride (GaN) semiconductor layer (p-GaN) and serves to supply holes, and
the second semiconductor layer is an n-type impurity-doped gallium nitride (GaN) semiconductor layer (n-GaN) and serves to supply electrons.

9. The nanorod LED according to claim 1, wherein the conductor layer is formed of at least one conductive material of indium tin oxide (ITO) and a metal material.

10. A display, comprising:
a plurality of nanorod LEDs aligned on an electrode pattern comprising first and second electrodes; and
a conductor layer formed on at least one semiconductor layer of a first semiconductor layer, a multi-quantum well structure layer, a second semiconductor layer and the first semiconductor layer and the second semiconductor layer,
wherein a length and shape of the conductor layer are controlled such that the multi-quantum well structure layer is disposed between the first electrode and the second electrode.

11. The display according to claim 10, wherein the electrode pattern comprises at least one electrode pattern of an interdigitated (IDT) pattern and a circle pattern.

12. The display according to claim 10, wherein the first semiconductor layer is a p-type impurity-doped gallium nitride (GaN) semiconductor layer (p-GaN) and severs to supply holes, and
the second semiconductor layer is an n-type impurity-doped gallium nitride (GaN) semiconductor layer (n-GaN) and serves to supply electrons.

13. The display according to claim 10, wherein the first electrode contacts a first conductor layer of the conductor layer, and the second electrode contacts a second conductor layer of the conductor layer.

* * * * *